United States Patent
Tsai et al.

(10) Patent No.: US 6,458,495 B1
(45) Date of Patent: Oct. 1, 2002

(54) TRANSMISSION AND PHASE BALANCE FOR PHASE-SHIFTING MASK

(75) Inventors: Wilman Tsai, Saratoga; Qi-De Qian, Santa Clara, both of CA (US)

(73) Assignee: Intel Corporation, Santa Clara, CA (US)

( * ) Notice: Subject to any disclaimer, the term of this patent is extended or adjusted under 35 U.S.C. 154(b) by 26 days.

(21) Appl. No.: 09/607,446

(22) Filed: Jun. 29, 2000

(51) Int. Cl.[7] ................................................ G03F 9/00
(52) U.S. Cl. ......................................................... 430/5
(58) Field of Search .......................... 430/5, 322, 323, 430/324; 216/24

(56) References Cited

U.S. PATENT DOCUMENTS 5,718,829 A * 2/1998 Pierrat ........................... 430/5

* cited by examiner

*Primary Examiner*—S. Rosasco
(74) *Attorney, Agent, or Firm*—Blakley Sokoloff Taylor & Zafman LLP

(57) ABSTRACT

The present invention comprises a phase-shifting mask and a process for fabricating such a phase-shifting mask. The phase-shifting mask has trenches with vertical sidewall profiles which are retrograde. The retrograde profiles balance the transmission and phase of the light transmitted through the phase-shifted openings relative to the non-phase-shifted openings. The retrograde profile may be formed from an isotropic plasma etch.

26 Claims, 4 Drawing Sheets

US 6,458,495 B1

TRANSMISSION AND PHASE BALANCE FOR PHASE-SHIFTING MASK

BACKGROUND OF THE INVENTION

1. Field of the Invention

The present invention relates to the field of semiconductor integrated circuit manufacturing, and more specifically, to a phase-shifting mask and a process for fabricating a phase-shifting mask.

2. Discussion of Related Art

Improvements in photolithography have allowed higher density and faster speed to be attained in semiconductor Integrated Circuits (ICs) by continually shrinking the devices. According to the Rayleigh criterion, the minimum Critical Dimension (CD) which can be resolved by a wafer stepper is directly proportional to the wavelength of the illumination source and inversely proportional to the Numerical Aperture (NA) of the projection lens. However, diffraction will degrade the aerial image when the CD becomes smaller than the actinic wavelength. The actinic wavelength is the wavelength of light at which a mask is used in a wafer stepper to selectively expose photoresist on a substrate.

Photolithography in the sub-actinic wavelength regime will benefit from wavefront engineering with Resolution Enhancement Techniques (RETs), such as Phase-Shifting Masks (PSMs), to achieve a sufficiently wide process latitude. Unlike a conventional binary mask that only modulates the amplitude of light, a PSM further controls the phase of light to take advantage of destructive interference to mitigate the detrimental effects of diffraction. An Alternating PSM (AltPSM) is particularly useful for patterning very small CDs, such as the gate length of a transistor in a device. AltPSM improves contrast by introducing a phase shift of 180 degrees between the light transmitted through adjacent clear openings to force the amplitude between the two images to zero.

A phase shift of 180 degrees can be implemented creating a difference in the optical path lengths through adjacent openings in an opaque layer, such as chrome. An additive process may be used to deposit a transparent layer, such as Spin-On-Glass (SOG), through openings in the chrome onto a transparent substrate, such as fused silica or quartz, followed by removal of the transparent layer in alternate openings. However, an additive process is susceptible to optical mismatch of materials in the light path and accompanying internal losses at the interfaces. Thus, it is more common to use a subtractive process to etch a trench into the quartz substrate in alternate openings.

However, an AltPSM that is fabricated with a subtractive process will scatter incident light off the sidewalls and bottom corners of the etched openings. The waveguide effect causes an aerial image imbalance which is manifested as a CD error and a placement error. The CD of the etched opening becomes smaller than the CD of the unetched opening. The space between the two openings appears displaced from the unetched opening towards the etched opening.

The aerial image in an AltPSM can be balanced in several ways. A CD biasing approach enlarges the etched opening relative to the unetched opening to balance the aerial image. As shown in FIG. 1, the phase-shifted opening 101 has a trench in the quartz 107 with a depth 117 and a width 111. The non-phase-shifted opening 103 has no trench and a width 113. The phase-shifted opening 101 and the non-phase-shifted opening 103 are separated by an opaque layer 105 with a width 115. The depth 117 corresponds to a phase shift of 180 degrees between the phase-shifted opening 101 and the non-phase-shifted opening 103. The width 111 of the trench includes a bias 109 per edge to increase transmission of the phase-shifted opening 101 relative to the non-phase-shifted opening 103.

An etchback approach, such as with an isotropic wet etch, recesses the sidewalls and corners laterally under the chrome to balance the aerial image. The etchback approach may be one-sided or two-sided. As shown in FIG. 2, the one-sided version of the etchback approach undercuts the substrate below the edges of the opaque layer 205 around the phase-shifted opening 201 only. The undercut 209 per edge increases transmission of the phase-shifted opening 201 relative to the non-phase-shifted opening 203 which is not undercut. The trench in the phase-shifted opening 201 has a depth 219 before the etchback and a depth 217 after the etchback. The depth 217 corresponds to a phase shift of 180 degrees.

The etchback approach may also be two-sided. As shown in FIG. 3, the two-sided version of the etchback approach undercuts the substrate below the edges of the opaque layer 305 around both the phase-shifted opening 301 and the non-phase-shifted opening 303. The phase-shifted opening 301 has a depth 119 before the etchback and a depth 317 after the etchback. The non-phase-shifted opening 303 only has a depth 339 after the etchback. A depth difference 341 is maintained between the two trenches which corresponds to a phase shift of 180 degrees. The undercut 309 per edge of the phase-shifted opening 301 and the undercut 329 per edge of the non-phase-shifted opening 303 determines the quartz width 525 underneath the chrome between the phase-shifted opening 301 and the non-phase-shifted opening 303.

As shown in FIG. 4, a dual-trench approach can also balance the aerial image by etching a deep trench with a depth 417 in the phase-shifted opening 401 and an adjacent shallow trench with a depth 439 in the non-phase-shifted opening 403. The two trenches are separated by chrome with a width 415. A depth difference 441 is maintained between the two trenches which corresponds to a phase shift of 180 degrees.

The various approaches for balancing the aerial image have disadvantages. The CD biasing approach is constrained to the discrete values available on the design grid. The etchback approach may cause defects, such as chipping or delamination of the overhanging chrome between adjacent openings. The dual-trench approach adds complexity and cost by requiring additional processing.

SUMMARY OF INVENTION

Thus, what is needed is a phase-shifting mask with balanced transmission and phase and a process for fabricating such a phase-shifting mask.

DETAILED DESCRIPTION OF THE PRESENT INVENTION

In the following description, numerous details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention describes a phase-shifting mask (PSM) with balanced transmission and phase and a process for fabricating such a PSM. The PSM in the present invention has retrograde vertical profiles in the boundaries around etched openings to balance transmission and phase between the phase-shifted openings and the non-phase-shifted openings. Balancing transmission and phase prevents CD error and placement error. The retrograde profile may be created with an isotropic etch, such as an isotropic plasma etch. Creating a retrograde error prevents chipping or delamination of the overhanging chrome between the phase-shifted opening and the adjacent non-phase-shifted opening.

Figure 1:
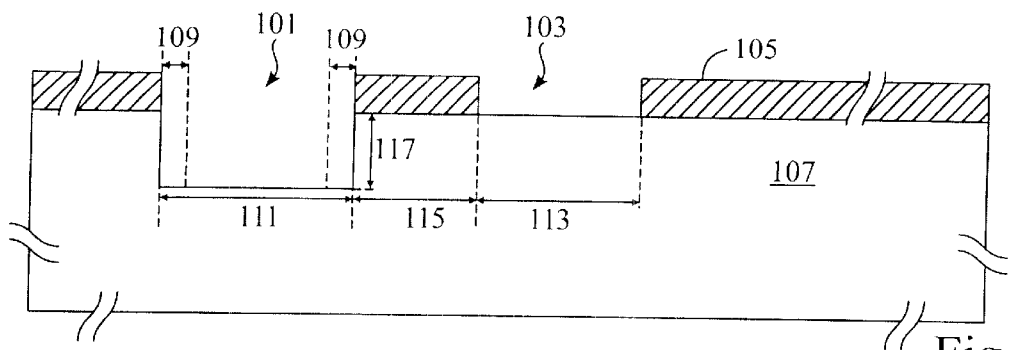
FIG. 1 is an illustration of a cross-sectional view of a single-trench alternating phase-shifting mask with CD biasing in the prior art.
Figure 2:
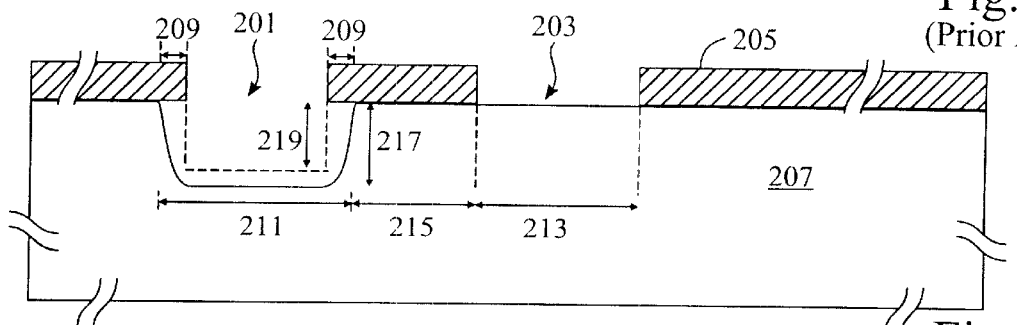
FIG. 2 is an illustration of a cross-sectional view of a single-trench alternating phase-shifting mask with one-sided etchback in the prior art.
Figure 3:
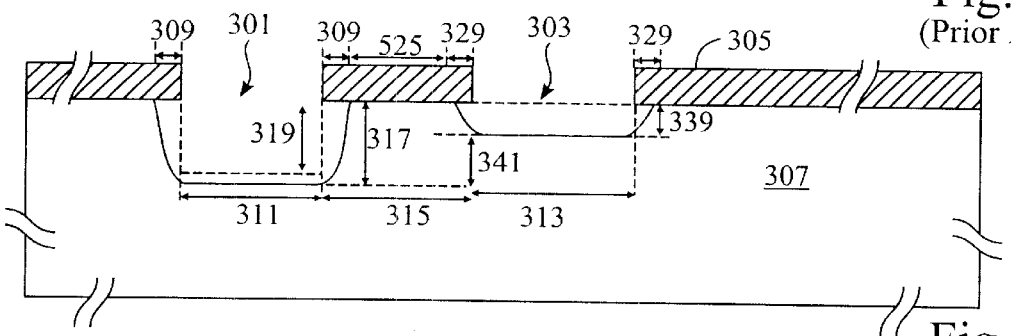
FIG. 3 is an illustration of a cross-sectional view of a single-trench alternating phase-shifting mask with two-sided etchback in the prior art.
Figure 4:
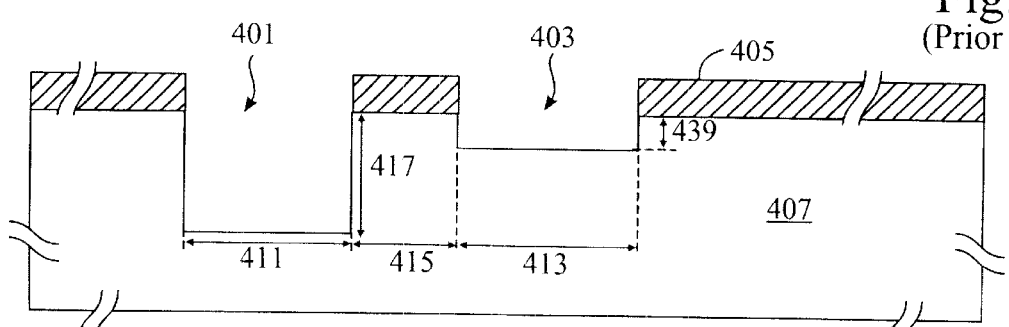
FIG. 4 is an illustration of a cross-sectional view of a dual-trench alternating phase-shifting mask in the prior art.
Figure 5:
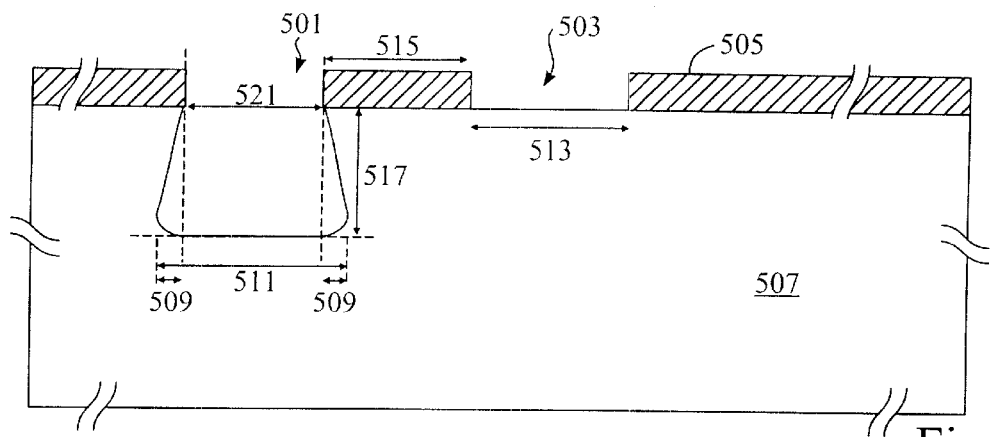
FIG. 5 is an illustration of an alternating phase-shifting mask with retrograde vertical profile in the phase-shifted opening according to the present invention.

Various embodiments of the PSM according to the present invention will be described first. A first embodiment is shown in FIG. 5 for an AltPSM with a layer 505 that is disposed over a substrate 507. The substrate 507 is transparent to light at the actinic wavelength. Fused silica ($SiO_2$), also known as quartz, is commonly used at illumination wavelengths of 436 nanometers (g-line of Mercury lamp), 365 nanometers (i-line of Mercury lamp), 248 nanometers (KrF excimer laser), and 193 nanometers (ArF excimer laser). However, fused silica quickly becomes opaque at wavelengths shorter than about 175 nanometers.

Crystalline fluorides, such as Calcium Fluoride ($CaF_2$), Magnesium Fluoride ($MgF_2$), Barium Fluoride ($BaF_2$), and Lithium Fluoride ($LiF_2$), are transparent at the illumination wavelength of 157 nanometers ($F_2$ excimer laser), but they have excessively large coefficients of thermal expansion and poor chemical etch resistance. Consequently, modified fused silica, such as low water (—OH) content-fused silica and fluorine ($F_2$)-doped silica, are more suitable for use as substrates for transmissive masks at 157 nanometers. One example of a modified fused silica substrate is AQF from Asahi Glass. An alternative is to switch from a transmissive mask to a reflective mask, but the requisite changes in the infrastructure of maskmaking will require considerable time and expense for the industry to implement.

The layer 505 is an absorber of light at the illumination wavelength. It typically comprises chrome of sufficient thickness to be opaque. The layer 505 is formed from Chromium (Cr), usually in a graded or multilayer structure. Oxygen (O) and Nitrogen (N) are included towards the upper surface to reduce reflection when the mask is used in a wafer stepper. Oxygen (O) is included towards the lower surface to improve adhesion to the substrate 507. The layer 505 may also be formed from refractory metals, such as Tungsten (W), metal silicides, such as Molybdenum Silicide (MoSi), metal nitrides, such as Tungsten Nitride (WN), amorphous Silicon (Si), or amorphous Carbon (C).

The phase-shifted opening 501 has a trench with an upper width 521, a depth 517, and a lower width 511. The adjacent non-phase-shifted opening 503 has an upper width 513. Essentially no trench is etched in the non-phase-shifted opening 503. The phase-shifted opening 501 and the non-phase-shifted opening 503 are separated by chrome with a width 515 that may be less than about 300 nanometers. This is the dimension on a typical mask that has features with 4× magnification. A wafer stepper may require masks with other magnifications, such as 10×, 6×, 5×, 2.5×, or 1×.

The depth 517 corresponds to a difference in the optical path length through the transparent substrate 507 between the phase-shifted opening 501 and the non-phase-shifted opening 503. A phase shift of 180 degrees is desired. The tolerance should be tightere than +/−2 degrees. The depth 517 has about the same magnitude of the illumination wavelength when the transparent substrate is quartz and the ambient is air.

The upper width 521 is smaller than the lower width 511 so the vertical profile of the sidewall of the trench is retrograde. The difference between the upper width 521 and the lower width 511 should be about 30 to 50 nanometers per edge. Numerical Aperture (NA) of the projection lens and partial coherence of the exposure light will determine the diffraction around the chrome at the edges of the trench. A wafer stepper will typically have an NA of 0.35 to 0.85 and a partial coherence of 0.30 to 0.80. Consequently, the optimal difference may vary with depth 517 and upper width 521.

The sidewall of the trench should be mostly straight with a smooth slope. The bottom surface of the etched trench should be flat and smooth, but, in some cases, the bottom surface may be concave or convex and rough. The bottom corners of the etched trench may be rounded. Deviations and non-uniformities in the size and shape of the trench will introduce errors in transmission and phase.

If desired, one or more layers may be included between the transparent substrate 507 and the overlying opaque layer 505. Such intermediate layers may serve to modify the aerial image during exposure of a wafer through the mask in a wafer stepper. For example, Molybdenum Silicide (MoSi or MoSiON) or Fluorine-containing chrome (CrFO) may be used for the shifter material in an attenuated embedded PSM (AttEPSM).

The intermediate layers may also help in the fabrication of the mask, such as to serve as an etch stop to control thickness of the transparent substrate or of any shifter material. If desired, the intermediate layers may subsequently be removed from the light path in the clear openings and only retained underneath the opaque layer.

Figure 6:
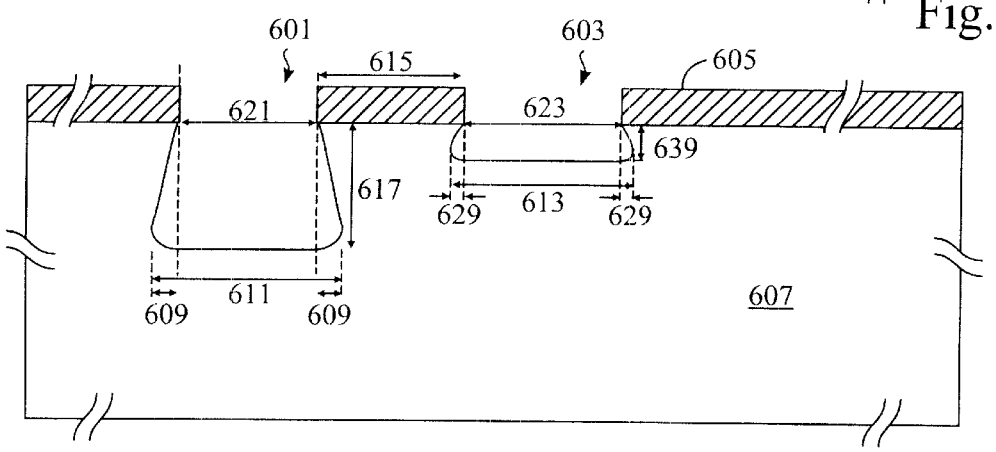
FIG. 6 is an illustration of an alternating phase-shifting mask with retrograde vertical profile in both the phase-shifted opening and the non-phase-shifted opening according to the present invention.

A second embodiment of an AltPSM according to the present invention is shown in FIG. 6. The phase-shifted opening 601 has a deep trench with an upper width 621, a depth 617, and a lower width 611 so the sidewall is retrograde. An AltPSM in the second embodiment is similar to the AltPSM in the first embodiment except that the non-phase-shifted opening 603 has a shallow trench with an upper width 623, a depth 639, and a lower width 613. The upper width 623 is smaller than the lower width 613 so the sidewall of the shallow trench is also retrograde. The retrograde sidewall in the non-phase-shifted opening 603 may differ from the retrograde sidewall in the phase-shifted opening 601. The trench in the non-phase-shifted opening 603 may be shallow or deep as long as it is shallower than the trench in the phase-shifted opening 601 by an amount which corresponds to a phase shift of 180 degrees.

The retrograde sidewall of the present invention may be used in other types of PSMs, including, but not limited to, a chromeless phase-edge PSM, a rim PSM with center trench, a rim PSM with rim trench, an inverted rim PSM, an attenuated PSM, an attenuated embedded PSM, or an outrigger PSM.

The retrograde sidewall of the present invention may be used in a reflective mask as a well as in a transmissive mask. The retrograde sidewall of the present invention is also compatible with other RETs, such as Off-Axis Illumination (OAI), Pupil Filtering (PF), and Optical Proximity Correction (OPC).

Synergy can often be derived from combining PSM with OPC. The CDs may be biased in the design to compensate for print bias and etch bias. It is particularly useful to iteratively simulate the aerial image resulting from using PSM with OPC. It can also be helpful to combine PSM with OAI to enhance certain types of features and layouts.

A process for fabricating an AltPSM, according to the present invention, will be described next. The mask is built from a mask blank which is available from various sources such as Hoya. A commonly used mask blank has dimensions of 6-inch×6-inch×0.250-inch (6025 type). Thicker mask blanks may be used as long as flatness, optical density, transmission uniformity, and defect levels remain well controlled. If desired, a 7-inch or 9-inch square mask blank may be used. The size of the mask blank may influence exposure field size, CD tolerance, placement tolerance, stepper throughput, and cost of ownership.

Figure 7:
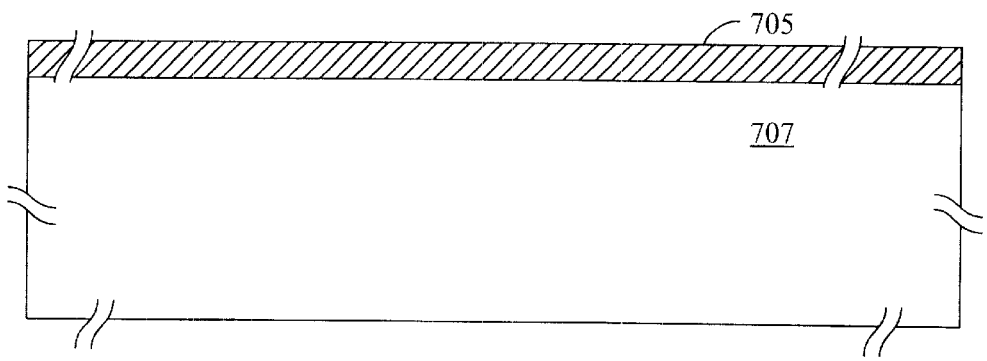
FIGS. 7–13 are illustrations of a process for forming retrograde vertical profiles according to the present invention.

FIG. 7 shows a mask blank which is made from a substrate 707, such as quartz, that is transparent at the actinic wavelength. The actinic wavelength is the wavelength of light at which a mask is used in a wafer stepper to selectively expose photoresist on a wafer. One surface of the mask blank has an overlying layer 705, such as chrome, that is opaque at the actinic wavelength. The chrome has a thickness of about 1000 to 2000 Angstroms. The outer portion of the chrome usually includes an inorganic Anti-Reflection Coating (ARC), such as AR8, which is optimized for the actinic wavelength to prevent flare in a wafer stepper. Surface reflectivity, edge roughness, and pinhole density of the chrome should be controlled tightly.

The process starts similarly to the processing for a binary mask. A laser-writer may be used with an optical first level photoresist if higher throughput is desired and the minimum resolution can still be achieved. However, it is more typical to apply an e-beam first level photoresist 804, such as the positive-tone ZEP 7000 from Nippon-Zeon, over the chrome 805 on the mask blank. The photoresist 804 should have high resolution and good CD linearity as well as good dry etch resistance. The photoresist 804 may have a thickness of about 2000 to 5000 Angstroms.

Patterning is accomplished with an e-beam writer which exposes the first level photoresist 804 by raster scanning a Gaussian beam at an accelerating voltage of 10 to 20 keV. The beam is modulated by turning it on and off as it scans across the entire mask blank. An example of a raster scan e-beam writer is a MEBES 5500 from Etec Systems.

When the design rule shrinks below about 180 nanometers, the required CD accuracy can only be achieved by using a Vector Scan Beam (VSB) with a variable shaped beam and an accelerating voltage of 50 to 75 keV. A series of rectangles of varying aspect ratio is used to pattern the desired features in the first level photoresist 804. First, a smaller beam size is selected to expose sleeves around the edges of the feature. Then a larger beam size is chosen to fill in the interior of the feature. Examples of vector scan e-beam writers include the HL-900M from Hitachi, the JBX-9000MV from JEOL, and the EBM-3000 from Toshiba Machine. Such systems must satisfy the tight specifications required for writing the masks for fabricating devices with 150 to 180 nanometers groundrules. For example, the e-beam writer should deliver pattern CD accuracy within-field (3-sigma) of less than 20 nanometers, pattern placement accuracy (3-sigma) of less than 30 nanometers, and field stitching accuracy (mean +/−3 sigma) of less than 20 nanometers.

The higher accelerating voltage reduces forward scattering and improves sidewall slope, especially of smaller features. However, the higher accelerating voltage also heats up the first level photoresist 804 so Chemically Amplified Resists (CARs) are needed. A 50 keV system deposits 25 times more energy into a mask blank than a 10 keV system. Electrons at 50 keV penetrate the first level photoresist 804 and end up about 10 micrometers into the glass substrate. The deposited energy produces heat which diffuses back into the first level photoresist 804 within a radius of about 25 micrometers. Resist heating changes the sensitivity of the first level photoresist 804 and is a major contributor to CD error.

Although inherently more demanding with regards to stability before and after baking, CARs have higher sensitivity and higher contrast than non-CARs. The CAR may be positive-tone, such as RE5153P from Hitachi Chemical. Alternatively, the CAR may be negative-tone, such as NEB-22A from Sumitomo Chemical or SAL-601 from Shipley. Throughput can be improved significantly by selecting positive tone photoresist for darkfield masks are negative tone photoresist for clearfield masks.

E-beam proximity effects degrade features that are smaller than about one micrometer. The proximity effect is caused by backscattered electrons that spread over an area of about 10 micrometers×10 micrometers and provide additional exposure to nearby features. The amount of proximity effect depends on accelerating voltage, substrate, photoresist, process, as well as size and location of the features that are being written.

Proximity Effect Correction (PEC) may be applied to improve CD accuracy. A first option is to pre-process the design data and perform pattern-specific resizing and shape correction. A second option is to modify the design data in real time and perform pattern-specific exposure dose modulation. As an example, shot time modulation may be used with vector scan of a variable shaped beam at 50 keV acceleration voltage. A third option is to incorporate signal processing, such as ghosting. Ghosting uses a large spot size with a low dose to expose the photoresist with the negative or complement of the original pattern. Ghosting may be used with raster scanning of a circular spot from a Gaussian beam at 10 keV acceleration voltage. In all cases, correcting for proximity effect is computationally intensive and detracts from the throughput.

Reactive Ion Etch (RIE) of the chrome 805 can be performed in a parallel plate reactor with a high density plasma source, such as an Inductively-Coupled Plasma (ICP) source. An example is a VLR or SLR etcher from Plasma-Therm equipped with an ICP head. It is also possible to use a Multi-Pole ICP (MICP) source having 6 magnetic poles with inductive coils to operate at 13.56 MHz to generate the plasma. Oxygen ($O_2$) is used for in-situ descum. The dry etch chemistry is based on Chlorine ($Cl_2$). Helium (He) is added to increase plasma density, reduce DC bias, and increase the selectivity of chrome over photoresist. In some case, it may be advantageous to add an assist gas or HCl.

Starting with the 130 nanometer generation, etch uniformity may be improved by using magnetic Neutral Loop Discharge (NLD) etching to achieve higher plasma density and lower gas pressure. An example of such a tool is the NLDE-9035 from ULVAC Coating.

The endpoint for etching chrome 805 may be detected by monitoring the reflected light intensity. The reflectivity of fused silica 807 is low and fairly invariant with wavelength while the reflectivity of thin chrome 805 increases with longer wavelength. Consequently, a laser with a long wavelength, such as 670 nanometers, can be used for Endpoint Detection (EPD).

The chrome-load affects first level photoresist 804 selectivity, chrome 805 etch rate, and CD uniformity. It is desirable to control etch selectivity to photoresist 804 so as to minimize erosion of first level photoresist 804. A carbon source may be used for sidewall passivation to help control chrome 805 profile and etch bias. The etch of chrome 805 is substantially anisotropic. The vertical profile of the sidewall of the openings 801 and 803 in the chrome will usually not significantly affect the aerial image since the chrome 805 is relatively thin. If MoSiON is used as a shifter in an AttEPSM, etching can be done with $CF_4/O_2$ gas.

Chrome 805 may be etched with a wet etch and an appropriate first level photoresist 804 if the CD tolerance is not stringent. The wet etch may include Ceric Ammonium Nitrate (($NH_4$)$_2$Ce($NO_3$)$_6$) with an oxidizing agent, such as nitric acid ($HNO_3$), acetic acid ($CH_3COOH$), or perchloric acid ($HClO_4$). The wet etch may be done in situ with development of the first level photoresist 804.

Figure 8:
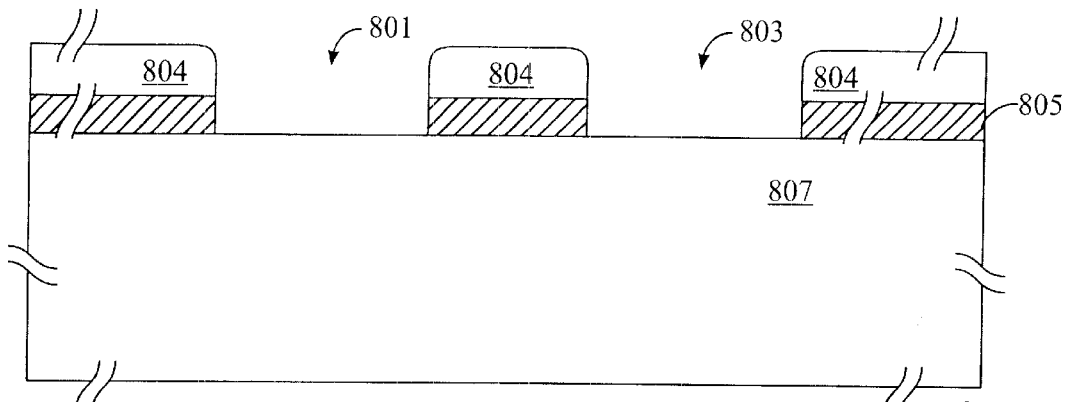
Figure 9:
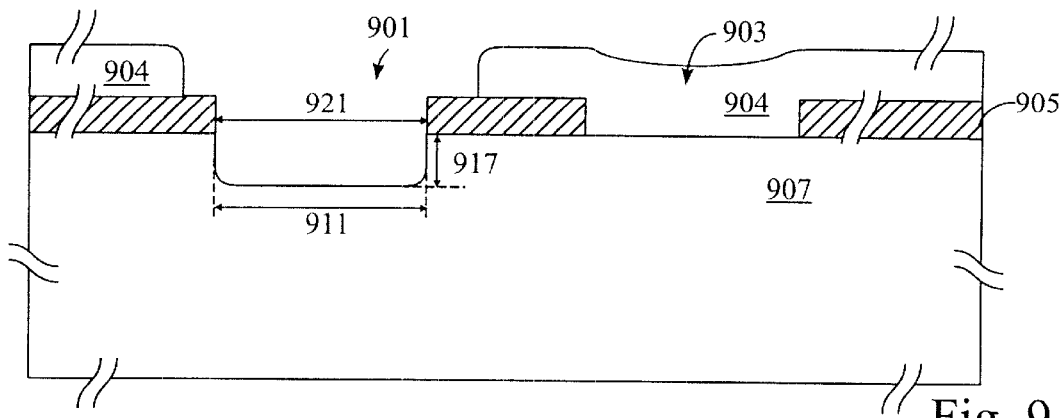

Additional processing beyond the processing for a binary mask is required to introduce a phase shift. An additive process with Spin-On-Glass (SOG) may be used, but a subtractive process in the substrate is more desirable. The first level e-beam photoresist 804 shown in FIG. 8 is stripped. Then, a second level optical photoresist 904, such as THMR-iP3600 from Tokyo Ohka Kogyou (TOK) or PFROA3 from Sumitomo Chemical, is applied as shown in FIG. 9. OCG 895i from Olin, may be used if a lower contrast is acceptable. The second level photoresist 904 may have a thickness of about 3000 to 6000 Angstroms.

The second level photoresist 904 is patterned with a laser writer that uses raster scan with a Gaussian beam that is split into multiple beams. An example is an ALTA 3500 system from Etec Systems that uses an Argon ion laser to generate ultraviolet light with a wavelength of about 364 nanometers. An ALTA 3500 system has a resolution limit of about 0.4 microns. Another example is an Omega6000 system from Micronic Laser Systems that uses a Krypton ion laser to produce exposure light with 413 nanometer wavelength.

Laser written features are susceptible to corner rounding and CD nonlinearity so laser proximity correction is usually incorporated to improve pattern fidelity. Laser writing is typically performed with multiple passes to average out subsystem errors that may otherwise degrade print quality. A 4-pass mode generally provides a good trade-off between throughput performance and print quality parameters, such as stripe butting, placement linearity, edge roughness, and CD uniformity.

As shown in FIG. 9, the openings 901 in the chrome 905 that are to be phase-shifted are uncovered by exposing and developing larger openings 900 in the second level photoresist 904. The openings 903 in the chrome 905 that are to be non-phase-shifted remain covered by the photoresist 904. The openings 900 in the second level photoresist 904 are aligned to the underlying chrome openings 901 and biased larger to accommodate overlay tolerance. The total overlay error is usually less than about +/−70 to 140 nanometers.

An e-beam writer may be used with an appropriate second level photoresist 904 if finer resolution is desired and the slower throughput is acceptable. An e-beam writer has better resolution and delivers higher pattern fidelity since the exposing beam has a smaller spot size. However, a laser writer has shorter write time, better alignment accuracy, and higher stability since the beam is not deflected by charging of the surface of the second level photoresist 904.

After the second level photoresist 904 is exposed and developed, RIE of the quartz 907 is performed with chemistry based on Fluorine (F). The etch may be done in a Magnetically Enhanced Reactive Ion Etching (MERIE) system such as MEPS6025 from ULVAC Coating.

It is desirable to use a voting technique to create the phase shift of 180 degrees. Voting significantly improves control of the phase, reduces the impact of any extraneous material which may block the etch, and helps to smooth out any etch non-uniformities which may occur over time or across the chamber of the reactor.

For example, etch of the quartz substrate 907 through openings 900 in the second level photoresist 904 may be done in three parts with the phase being shifted by about 60 degrees for each part. The photoresist is stripped after the etch for each part so the phase shift angle and transmittance may be measured by a tool such as MPM-248 or MPM-193 from Lasertec. The etch time can be adjusted as needed based on feedback from the phase measurement. Alignment of the openings 900 in the second level photoresist 904 is not very critical since the upper width 921 of the trench is determined by the edge of the chrome opening 901 which remains fixed for all three parts of the etch. The second level photoresist 904 covers the chrome openings 903 that are to be non-phase-shifted.

FIG. 9 shows trenches which have been etched for a fixed time, after applying second level photoresist 904 for the first part, to produce a depth 917 which corresponds to a phase shift of about 60 degrees. The chrome opening 901 determines the upper width 921 of the trenches. The quartz etch is substantially anisotropic so the sidewall has an angle of 85 degrees or greater.

Figure 10:
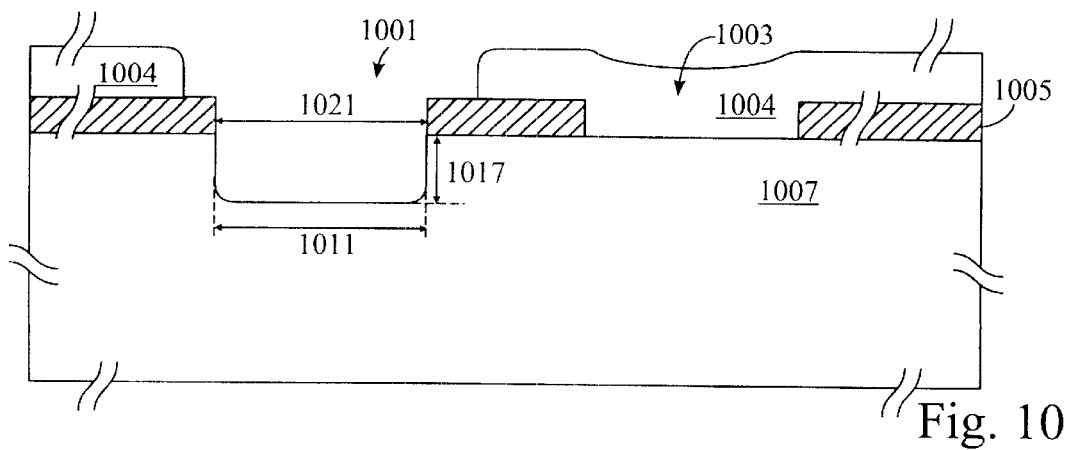

FIG. 10 shows trenches which have been etched For a fixed time, after applying photoresist 1004 for the second part, to produce a depth 1017 which corresponds to a phase shift of about 120 degrees.

Figure 11:
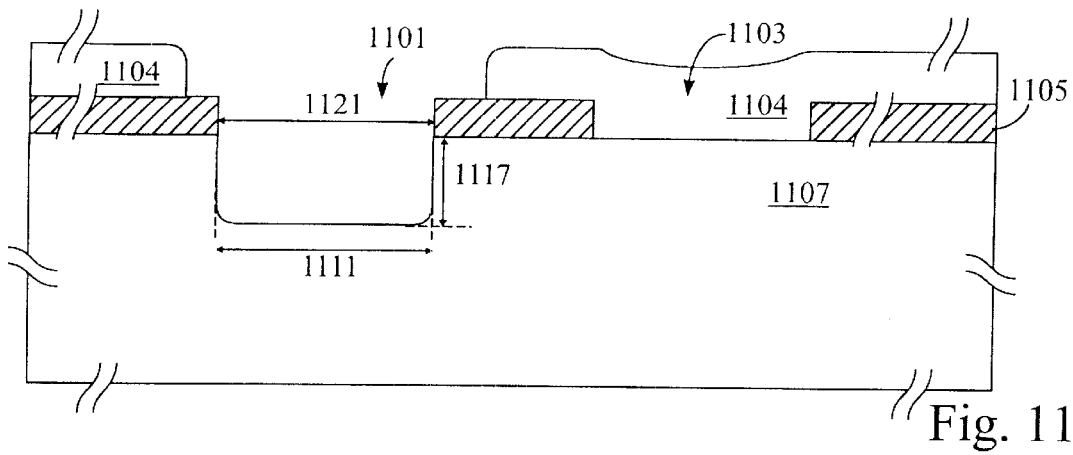

FIG. 11 shows trenches which have been etched for a fixed time, after applying photoresist 1104 for the third part, to produce a depth 1117 which corresponds to a phase shift of about 175 degrees. The target phase is adjusted so that a phase of 180 degrees may be achieved after the retrograde sidewall profile is created.

Next, a retrograde sidewall profile is created to balance the aerial image through the phase-shifted opening and the non-phase-shifted opening. The process involves an isotropic dry etch, such as an isotropic plasma etch. A mixture of a fluorine(F)-containing gas, such as $CF_4$, and an inert gas may be used. Parameters affecting the etch, such as pressure, RF power, composition of the gas mixture, plate holder composition, and plate holder geometry, can be optimized to achieve the desired phase and retrograde profile with good uniformity.

Figure 12:
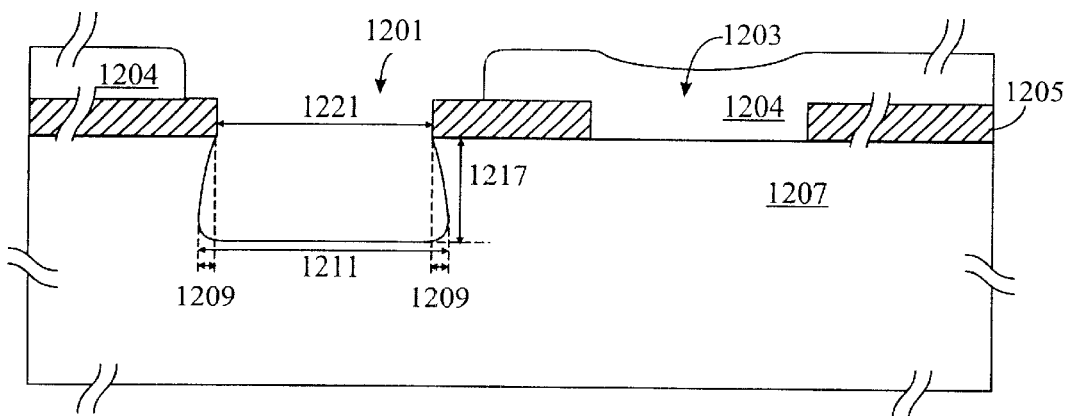

In one embodiment, the retrograde profile may be one-sided and only done in the phase-shifted openings. In this case, the etch to create the retrograde profile can be performed subsequent to or concurrent with the quartz etch. FIG. 12 shows trenches that have been etched after the third part to produce a vertical sidewall profile which is retrograde. The trenches in the phase-shifted openings 1201 have an upper width 1221 that is smaller than the lower width 1211. The final depth 1217 should correspond to a phase shift of 180 degrees with a tolerance that is tighter than +/−2 degrees. The second level photoresist 1204 shown in FIG. 12 may be a new layer of photoresist or may be the same second level photoresist 1104 shown in FIG. 11.

Figure 13:
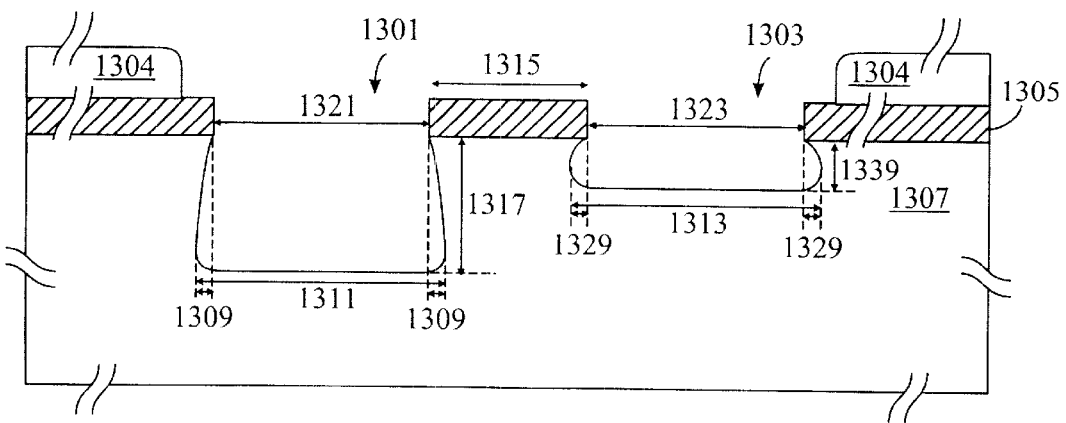

In an alternative embodiment, the retrograde profile may be two-sided. FIG. 13 shows an embodiment of the present invention where shallow trenches are also etched in the non-phase-shifted openings. Depending on the selectivity of the two-sided etch process, photoresist 1304 may or may not be needed. The shallow trenches have a vertical sidewall profile that is retrograde. The shallower trenches in the non-phase-shifted openings 1303 have an upper width 1323 that is smaller than the lower width 1313. The shallower trenches and the deeper trenches are separated by chrome with a width 1315. The deeper trenches in the phase-shifted openings 1301 have an upper width 1321 that is smaller than the lower width 1311.

After stripping photoresist, a plasma process or a wet process may be used to clean up the substrate and remove any undesirable film or defect that may be present. A shorter or less aggressive version of a conventional isotropic wet etch may also be used to remove defects.

A further embodiment includes embedding layers to serve as etch stops for the quartz etch. However, such additional layers may add complexity and affect the aerial image unless they are completely removed prior to completion of fabrication.

Many embodiments and numerous details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a phase-shifting mask with retrograde vertical sidewall profiles in the etched trenches and a process for fabricating such a phase-shifting mask.

We claim:

1. A method of fabricating a phase-shifting mask for use with a light at a wavelength comprising:
   a substrate formed from a transparent material, said substrate having a first thickness, said substrate comprising a first region, a second region, and a third region,
   forming an opaque layer on said substrate,
   using a first etch to remove said opaque layer in said first region and said second region,
   using a second etch to form a trench in said first region, said trench having an upper width and a lower width, and
   using a third etch to make said lower width larger than said upper width and to reduce said substrate in said first region to a second thickness, such that said light at said wavelength transmitted through said first region is shifted in phase by 180 degrees relative to said light at said wavelength transmitted through said second region.

2. The method of claim 1 wherein said first etch comprises an anisotropic dry etch.

3. The method of claim 1 wherein said second etch comprises an anisotropic dry etch.

4. The method of claim 1 wherein said third etch comprises an isotropic etch.

5. The method of claim 1 wherein said third etch comprises a plasma etch.

6. The method of claim 1 wherein said third etch comprises $CF_4$ gas.

7. The method of claim 1 wherein said third etch immediately follows said second etch without any intervening delay.

8. The method of claim 1 wherein said third etch and said second etch are performed concurrently.

9. A method of fabricating a phase-shifting mask for use with light at a wavelength comprising:
   a substrate, said substrate formed from a transparent material, said substrate having a first thickness, said substrate comprising a first region, a second region, and a third region,
   forming an opaque layer on said substrate,
   using a first etch to remove said opaque layer in said first region and said second region,
   using a second etch to form a first trench in said first region by reducing said substrate to a second thickness such that light at said wavelength transmitted through said first region is shifted in phase by 180 degrees relative to said first thickness, said first trench having an upper width and a lower width, and
   using a third etch to make said lower width larger than said upper width in said first trench, said third etch also forming a second trench in said second region.

10. The method of claim 9 wherein said first etch comprises an anisotropic dry etch.

11. The method of claim 9 wherein said second etch comprises an anisotropic dry etch.

12. The method of claim 9 wherein said third etch comprises an isotropic etch.

13. The method of claim 9 wherein said third etch comprises a plasma etch.

14. The method of claim 9 wherein said third etch comprises $CF_4$ gas.

15. A phase-shifting mask for use with light at a wavelength comprising:
   a substrate,
   a first region located on said substrate, said first region having a first thickness of a first material, said first material having a first amount of transmission of light at said wavelength, said first region having a boundary with a first retrograde vertical profile,
   a second region located on said substrate, said second region having a second thickness of said first material, such that said second thickness is greater than said first thickness by a first difference, said first difference being equivalent to a phase shift of 180 degrees at said wavelength, and a third region located on said substrate, said third region having a third thickness of said first material, such that said third thickness is equal to or greater than said second thickness.

16. The phase-shifting mask of claim 15 wherein said second region has a boundary with a second retrograde vertical profile.

17. The phase-shifting mask of claim 16 wherein said second retrograde vertical profile differs from said first retrograde vertical profile.

18. The phase-shifting mask of claim 15 wherein said second region adjoins said first region.

19. The phase-shifting mask of claim 15 wherein said second region and said first region are alternately disposed.

20. The phase-shifting mask of claim 15 wherein said third region is disposed between said first region and said second region.

21. The phase-shifting mask of claim 15 wherein said second region surrounds said first region.

22. The phase-shifting mask of claim 15 wherein said first region surrounds said second region.

23. The phase-shifting mask of claim 15 further having a second material overlying said first material in said second region and said third region, said second material having a second amount of transmission of light at said wavelength.

24. The phase-shifting mask of claim 23 further having a third material overlying said second material in said third region, said third material being opaque to light at said wavelength.

25. The phase-shifting mask of claim 15 further having a third material overlying said first material in said third region, said third material being opaque to light at said wavelength.

26. The phase-shifting mask of claim 15 further comprising Optical Proximity Correction (OPC).

* * * * *